United States Patent
Choi et al.

(10) Patent No.: US 8,288,776 B2
(45) Date of Patent: Oct. 16, 2012

(54) HYBRID ELECTRIC DEVICE USING PIEZOELECTRIC POLYMER SUBSTRATE

(75) Inventors: Won-Kook Choi, Seoul (KR); Sang Yub Ie, Gyeonggi-do (KR); Dong Hee Park, Seoul (KR); Ji Hwan Kim, Gyeongsangnam-do (KR); Dong Soo Lee, Gyeonggi-do (KR); In Seok Park, Gyeonggi-do (KR); Dong Ik Son, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 27 days.

(21) Appl. No.: 12/918,651

(22) PCT Filed: Jun. 26, 2008

(86) PCT No.: PCT/KR2008/003692
§ 371 (c)(1),
(2), (4) Date: Aug. 20, 2010

(87) PCT Pub. No.: WO2009/104840
PCT Pub. Date: Aug. 27, 2009

(65) Prior Publication Data
US 2010/0328328 A1  Dec. 30, 2010

(30) Foreign Application Priority Data
Feb. 22, 2008  (KR) .................. 10-2008-0016227

(51) Int. Cl.
*H01L 27/15* (2006.01)
*H01L 31/12* (2006.01)
*H01L 33/00* (2010.01)

(52) U.S. Cl. ........................................................ 257/79
(58) Field of Classification Search .................. 257/79, 257/98; 345/82, 530; 216/13
See application file for complete search history.

(56) References Cited

U.S. PATENT DOCUMENTS

| 5,796,854 A | 8/1998 | Markow |
| 7,342,556 B2 * | 3/2008 | Oue et al. ........................ 345/33 |
| 2007/0102711 A1 * | 5/2007 | Aoyagi et al. .................. 257/79 |

FOREIGN PATENT DOCUMENTS

| EP | 1189290 | 3/2002 |
| JP | 2002-064231 | 2/2002 |
| JP | 2004-165267 | 6/2004 |

OTHER PUBLICATIONS

International Search Report for PCT/KR2008/003692 mailed Feb. 16, 2010.

* cited by examiner

*Primary Examiner* — Phuc Dang
(74) *Attorney, Agent, or Firm* — Lowe Hauptman Ham & Berner, LLP

(57) ABSTRACT

The present invention relates to an integrated, composite hybrid electric device in which various devices are formed as a single unit on one flexible substrate, and a fabrication method thereof. More particularly, the present invention a hybrid electric device in which a display device, a vibration-generating (or vibration-sensing) device, and a non-volatile memory device are formed on a single flexible piezoelectric polymer substrate into a single unit by using a flexible piezoelectric polymer substrate whose both surfaces are thinly deposited with a patterned transparent oxidation electrode, and a fabrication method thereof.

6 Claims, 13 Drawing Sheets

HYBRID ELECTRIC DEVICE USING PIEZOELECTRIC POLYMER SUBSTRATE

CROSS REFERENCE TO RELATED APPLICATION

This application claims the priority of Korean Patent Application No. 10-2008-0016227, filed on Feb. 22, 2008 in the KIPO (Korean Intellectual Property Office), the disclosure of which are incorporated herein in their entirety by reference. Further, this application is the National Phase application of International Application No. PCT/KR08/003692, filed Jun. 26, 2008, which designates the United States and was published in English. Each of these applications is hereby incorporated by reference in their entirety into the present application.

TECHNICAL FIELD

The present invention relates to a multi-functional integrated composite device and fabrication method thereof. More particularly, the present invention relates to a hybrid electric device in which the functions of a display device, a vibration-generating device (or vibration-sensing device) and a non-volatile memory device can be implemented on a single flexible polymer substrate by using a piezoelectric polymer substrate formed with a micron-sized electrode pattern, and a fabrication method thereof.

BACKGROUND ART

Currently, owing to the remarkable advancement of electric and electronic technologies, electric and electronic devices having various functions are being developed.

For example, there are continuously developed various electric devices such as light-emitting devices for emitting light using an electrical signal, memory devices for storing information therein, short/long-range wireless communication devices, sensor devices and the like. Also, portable terminals, digital equipment or information communication devices such as display devices, cellular phones, MP3 players, digital cameras or the like are diversely developed by employing the above electric devices.

Among them, for example, in case of the memory devices, a NAND flash memory used intensively for storage devices for cellular phones, MP3 players, digital cameras or the like is a non-volatile memory device which has addressed and solved a shortcoming of a DRAM device performing a volatile operation.

Particularly, an organic bistable device (OBD) is a memory device which is constructed such that conductive single-molecular, low-molecular and high-molecular bistable resistant organic layers are sandwiched between an upper metal electrode and a lower metal electrode. Such a memory device is known as being based on a new memory implementation concept in which the entire structure of the memory device is made up of one transistor and one resistor (1T1R).

Currently, reliability improvement of the devices or equipment, miniaturization, lightness, thinness of the film, enhancement of degree of integration and portability, and minimal reduction of the manufacturing cost are taken most preferentially into consideration to develop the above electric devices and conduct researches to apply them to electronic equipment with a variety of functions.

Formation of an electric device on a flexible substrate is taken as an example of development of a technology to accomplish miniaturization, lightness and thinness of the film. By virtue of this technology development, the enhancement of portability and the reduction of the manufacturing cost can be achieved.

A use example of the flexible substrate includes a film speaker which is adapted to implement, in the form of a film, a speaker function in which an analog electric signal is converted into a sound wave is implemented using a characteristic in which a piezoelectric polymer film such as a polyvinylidene fluoride (PVDF) film generates a vibration in response to an electric signal.

The film speaker employs a piezoelectric film which generates mechanically vibration when an electrical signal is applied thereto. Also, the film speaker reproduces sound using an inverse piezoelectric effect in a non-magnetically driven scheme in which a magnet is absent and provides an advantage of capable of significantly reducing the weight and thickness of the speaker and the manufacturing cost.

In addition, a technology for applying the film speaker to a flat panel video monitor is disclosed in U.S. Pat. No. 5,796,854 (1998 Aug. 18) entitled "a thin film speaker apparatus for use in a thin film video monitor device" wherein a display device and a vibration-generating device are actuated in independent spaces, respectively, with them separated from each other, but not being not actuated as an integrated composite device.

Currently, the demand for miniaturization, lightness, thinness of the film, reduction of the manufacturing cost, improvement of portability and the like of the electronic equipment is gradually increasing. Therefore, there is an urgent need for an integrated composite device.

As an example of the integrated composite device, an attempt has been made to develop a multi-functional integrated composite device in which various devices such as a display device, a memory device or the like together with a thin film speaker (vibration-generating device)/vibration-sensing device are implemented on a single substrate by using a piezoelectric polymer substrate having flexibility to thereby share a flexible substrate.

The use of a flexible piezoelectric polymer substrate which has been known so far has been limited to a single purpose for use in a vibration sensor or a sound-generating apparatus (vibration-generating apparatus) such as a speaker or the like.

The reason for this is that since the polymer substrate is susceptible to heat and may be easily damaged by an organic solvent such as acetone or the like used in a photoresist (PR) process to remove a photoresist layer, it is impossible to apply a typical etching process to the polymer substrate, thereby making it difficult to implement a micron-sized electrode pattern. Also, the pattern of an electric conductor for use in an existing sound-generating device is not a precise micro pattern of a micrometer level.

A pattern formation technique for implementation of electronic devices on a flexible thermoplastic polymer substrate has not been established so far, and a pattern formation method using the same print scheme as illustrated in existing patents has a critical shortcoming in that the surface adhesion strength between an electrode and a substrate is weakened.

Particularly, a nano-imprint method illustrated in existing patents has a limitation in mass-production due to a lack of reliability and repeatability of the process as well as a degradation of adhesion strength at the interface between the electrode and the substrate. A laser induced thermal imaging (LITI) as a laser transfer method also has a limitation in providing a stable micron-sized electrode pattern on a flexible substrate surface.

Like this, there are various technical limitations in performing an effective patterning process for allowing a polymer substrate made of PVDF or the like to act as a substrate for an electronic device. As a result, the patterning technique is limited to a technical level in which an illuminant or a phosphorescent substance is merely coated on the PVDF substrate and a substantial implementation of the micron-sized electrode pattern is not suggested clearly.

As described above, a lack of a patterning process which takes thermal instability and low heat resistance of a thermoplastic polymer into consideration acts as a great barrier in fabrication of a multifunctional composite device. There is an urgent need for simultaneously achieving the maintenance of adhesion strength at the interface between the electrode and the substrate as well as the low-temperature pattern formation which are most fundamental and critical factors in the development of a flexible electronic device.

The information disclosed in this Background of the Invention section is only for enhancement of understanding of the background of the invention and should not be taken as an acknowledgment or any form of suggestion that this information forms the prior art that is already known to a person skilled in that art.

DISCLOSURE

Technical Problem

The present invention has been made in an effort to solve the above problems occurring in the prior art, and it is an object of the present invention to provide a hybrid electric device and fabrication method thereof in which a thin film speaker (vibration-generating device)/vibration-sensing device, a display device and a non-volatile memory device are formed on a single flexible piezoelectric polymer substrate into a single unit by using a flexible piezoelectric polymer substrate whose both surfaces are thinly deposited with a patterned transparent oxidation electrode, thereby making it possible to manufacture high-efficiency and multi-functional electronic equipment enabling for miniaturization, lightness, thinness thereof and having improved portability and mobility, and providing merits of cost reduction and the like.

Technical Solution

In order to accomplish the above object, in one aspect, the present invention provides a hybrid electric device using a piezoelectric polymer substrate, the hybrid electric device being constructed by forming an integrated unit in which a display device and a vibration-generating or -sensing device share the piezoelectric polymer substrate, wherein the hybrid electric device comprises: a flexible piezoelectric polymer substrate; an electrode pattern formed by vacuum-depositing an electrode material on both surfaces of the flexible piezoelectric polymer substrate to form electrode thin films and patterning at least one of the electrode thin films through a laser irradiation-based room-temperature dry etching process a light-emitting layer stacked on the electrode pattern; and an electrode stacked on the light-emitting layer, wherein the display device uses the electrode pattern on which the light-emitting layer is stacked and the electrode stacked on the light-emitting layer as electric conductors, and the vibration-generating or -sensing device uses the electrodes formed on the both surfaces of the flexible piezoelectric polymer substrate as electric conductors.

In a preferred embodiment, the hybrid electric device is constructed by forming an integrated unit in which a memory device shares the piezoelectric polymer substrate together with the display device and the vibration-generating or -sensing device. The hybrid electric device further comprises: a conductive polymer layer stacked on the electrode pattern, the conductive polymer having nano-particles contained therein and an electrode stacked on the conductive polymer layer, wherein the memory device uses the electrode pattern on which the conductive polymer layer is stacked and the electrode stacked on the conductive polymer layer as electric conductors.

Also, in another aspect, the present provides a method of fabricating a hybrid electric device using a piezoelectric polymer substrate, the hybrid electric device being constructed by forming an integrated unit in which a display device and a vibration-generating or -sensing device share the piezoelectric polymer substrate, wherein the method comprises the steps of: forming an electrode pattern by vacuum-depositing an electrode material on both surfaces of a flexible piezoelectric polymer substrate to form electrode thin films and patterning at least one of the electrode thin films through a laser irradiation-based room-temperature dry etching process stacking a light-emitting layer on the electrode pattern; and stacking an electrode on the light-emitting layer, wherein the display device uses the electrode pattern on which the light-emitting layer is stacked and the electrode stacked on the light-emitting layer as electric conductors, and the vibration-generating or -sensing device uses the electrodes formed on the both surfaces of the flexible piezoelectric polymer substrate as electric conductors.

In another preferred embodiment, the hybrid electric device is constructed by forming an integrated unit in which a memory device shares the piezoelectric polymer substrate together with the display device and the vibration-generating or -sensing device. The method of fabricating a hybrid electric device further comprises the steps of: stacking a conductive polymer layer on the electrode pattern, the conductive polymer having nano-particles contained therein and stacking an electrode on the conductive polymer layer, wherein the memory device uses the electrode pattern on which the conductive polymer layer is stacked and the electrode stacked on the conductive polymer layer as electric conductors.

Advantageous Effects

According to the multi-functional integrated hybrid electric device and fabrication method thereof, since the various functions of a display device, and a non-volatile memory device, a vibration (sound)-generating device/speaker, a vibration-sensing device, a long/short-range wireless communication device and the like can be implemented on a single flexible polymer substrate, the area needed to occupy the devices is greatly reduced, thereby making it possible to manufacture high-efficiency and multi-functional electronic equipment enabling for miniaturization, lightness, thinness thereof and having improved portability and mobility, and providing merits of cost reduction and the like.

In addition, various devices such as semiconductor devices, communication devices, sensors and the like are integrally implemented on the single flexible substrate by overcoming the conceptual limitation of a flexible display device implementing an existing visual display function as well as the conventional viewpoint suggesting a simple speaker-based electronic equipment concept, thereby addressing and solving the temporal and physical shortcomings according to an existing construction for separating a display device, a speaker, a memory for storing electrical signals therein, and a calculation/operation unit from one another.

Since the hybrid display device of the present invention has a variety of applicability fields while having various advantages including being transparent, well flexible, convenient to carry, and low in its driving voltage, it is expected to create lots of market demands in at home and abroad.

DESCRIPTION OF DRAWINGS

The above and other objects, features and advantages of the present invention will be apparent from the following detailed description of the preferred embodiments of the invention in conjunction with the accompanying drawings, in which.

Figure 1:
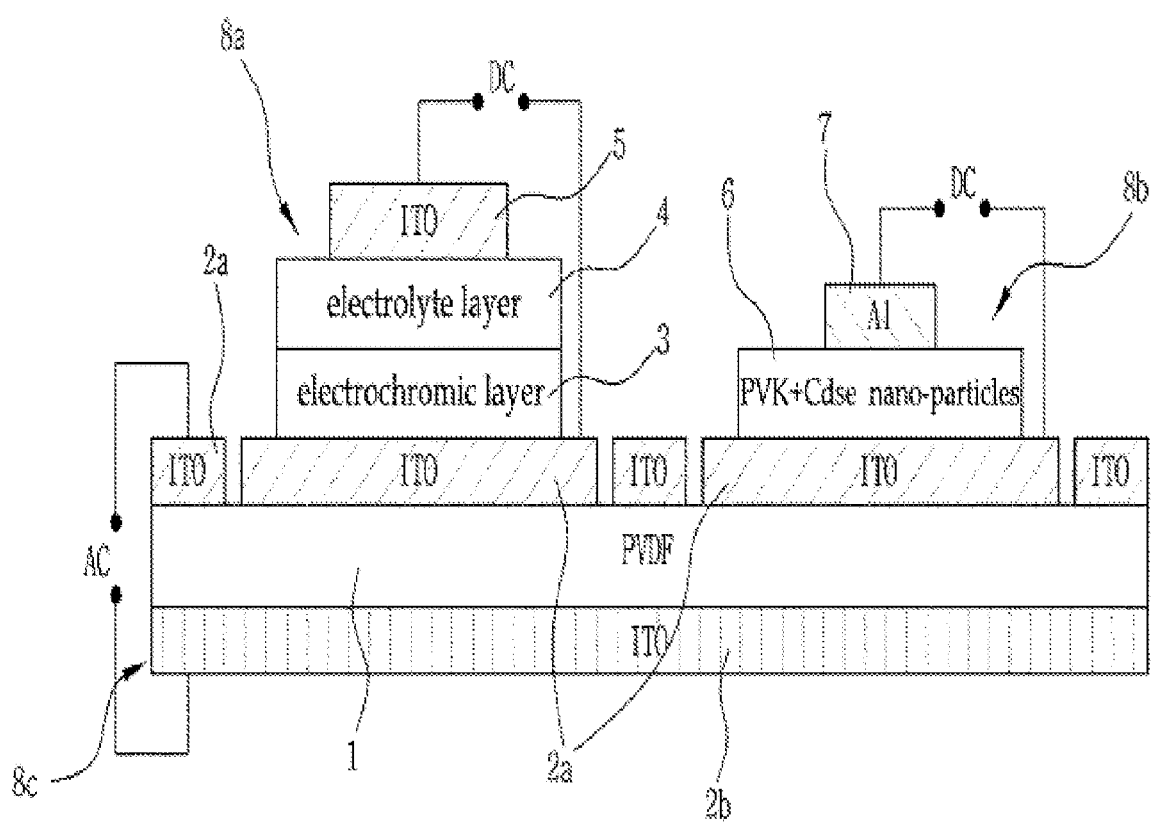
FIG. 1 is a schematic cross-sectional view showing an integrated, composite hybrid electric device according to a preferred embodiment of the present invention.

Reference numerals set forth in the Drawings includes reference to the following elements as further discussed below:
1: flexible piezoelectric polymer substrate
2a: electrode pattern
2c: electrode
2d: insulating layer
8a: display device
8b: memory device
8c: vibration-generating device

BEST MODE

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

The terminology herein is merely used to describe specific embodiments of the invention, but is not intended to limit the invention. The singular forms "a", "an" and "the" includes plural referents unless the context clearly dictates otherwise.

It should be appreciated that the terms "comprise(s)", "comprising", "include(s)", and "including", or "have(has)" when used in this specification and in the following claims are intended to specify the presence of stated features, integers, steps, acts, elements, components or combinations thereof, but they do not preclude the presence or addition of one or more other features, integers, steps, acts, elements, components or combinations thereof.

The present invention is directed to a novel composite flexible composite electric device and fabrication method thereof in which various devices are formed on a single flexible substrate into a single unit. More particularly, the present invention is directed to a hybrid electric device and fabrication method thereof in which a display device (light-emitting device), a vibration-generating device/vibration-sensing device, a non-volatile memory device are formed on a single flexible piezoelectric polymer substrate into a single unit by using a flexible piezoelectric polymer substrate whose both surfaces are thinly deposited with a patterned transparent oxide electrode.

Particularly, the present invention is directed to a hybrid electronic device fabricated by a process in which after a conductive material such as a transparent oxide electrode has been deposited on both surface of the piezoelectric polymer substrate using a vacuum vapor deposition method, a precise micron-sized electrode pattern required for the implementation of a functional device is obtained from the transparent oxide electrode by using a room-temperature dry etching technique employing a laser beam irradiation method, and then a display device, a non-volatile memory device and a vibration-generating device are formed on a single substrate formed with the micron-sized electrode pattern.

The use of the hybrid electric device of the present invention enables a speaker, a memory and a flexible display device having a composite arithmetic function built therein to be integrally formed as a single unit. An integrated composite display device using the hybrid electric device of the present invention has an advantage in that since it can be up-scaled and is lightweight, mobility and portability thereof are very excellent, thereby enabling to be applied to the next-generation large-scale flexible display device.

Now, a preferred embodiment of according to the present invention will be described hereinafter in detail with reference to the accompanying drawings.

Figure 2:
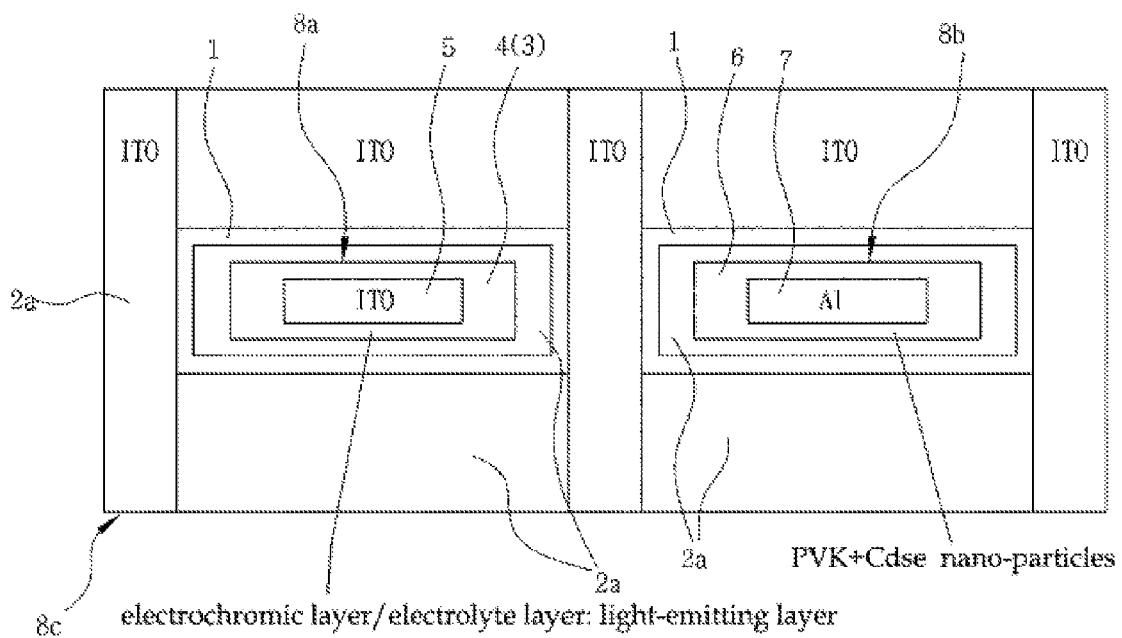
FIG. 2 is a schematic top view showing the integrated, composite hybrid electric device shown in FIG. 1

FIG. 1 is a schematic cross-sectional view showing an integrated, composite hybrid electric device according to a preferred embodiment of the present invention, and FIG. 2 is a schematic top view showing the integrated, composite hybrid electric device shown in FIG. 1. In FIGS. 1 and 2, there is shown a flexible electronic device using a polyvinylidene fluoride (hereinafter, referred to as "PVDF") substrate as an example of the flexible piezoelectric polymer substrate.

The integrated, composite hybrid electric device shown in FIG. 1 is fabricated by forming three devices 8a, 8b and 8c for emitting light, storing data and generating vibration, respectively, on a single flexible substrate 1 depending on a certain rule. A piezoelectric polymer substrate is used as the flexible substrate 1 used for fabrication of the hybrid electric device of the present invention.

In the present invention, as the flexible piezoelectric polymer substrate 1, a PVDF substrate can be used which is subjected to mechanical poling under an electric field after stretched, can mechanically vibrate molecular arrangement under the electric field being applied, and on the contrary, can generate an electrical signal when molecules are moved due to the mechanical vibration.

In the present invention, since the use of such a PVDF substrate 1 enables three devices 8a, 8b and 8c to be formed on a single substrate, the integrated hybrid electric device can be fabricated in which the three devices share the single substrate. In this case, a display device 8a, a non-volatile memory device 8b, a vibration-generating device (which can be also used as a vibration-sensing device) 8c are formed on the PVDF substrate so that a multifunctional hybrid electric device of the present invention sharing a single substrate can be fabricated.

In order to fabricate the devices 8a, 8b and 8c having respectively different functions, it is required that electrode patterns 2a and 2b to be used as electric conductors should be first formed on the PVDF substrate 1.

Figure 3:
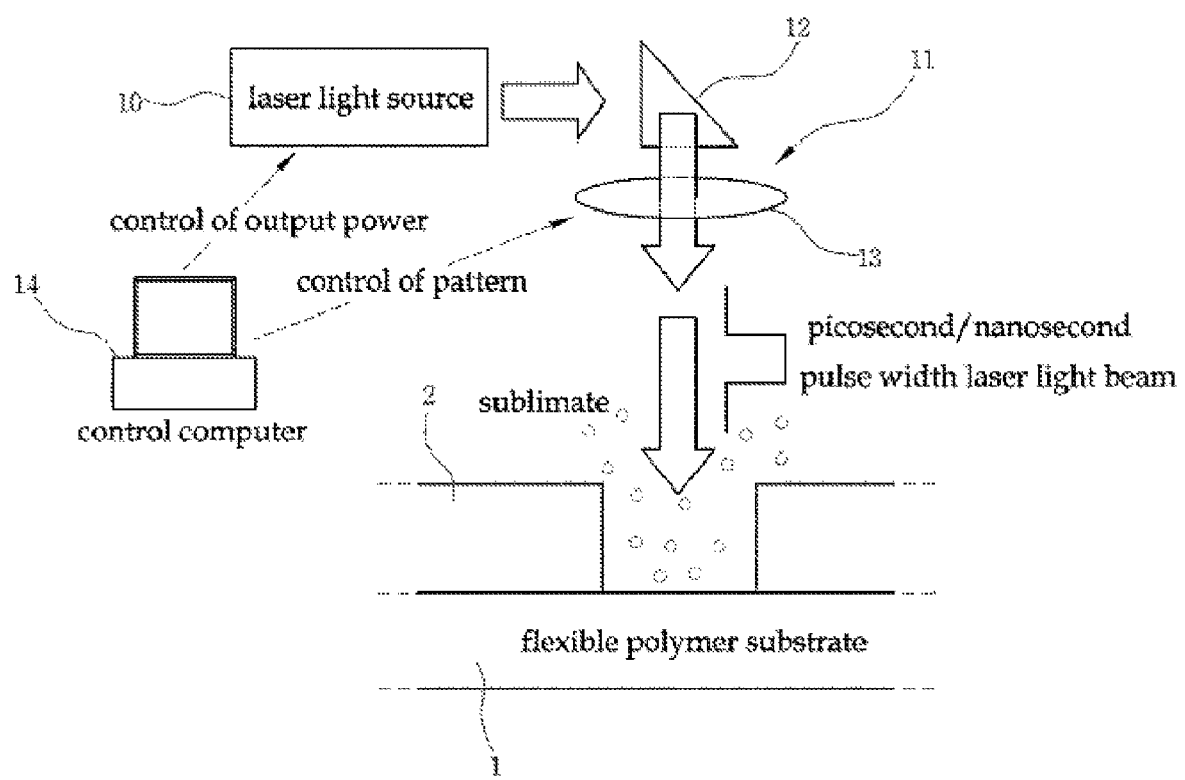
FIG. 3 is a schematic view showing a laser etching process of forming an electrode pattern on a piezoelectric polymer substrate in the fabrication process of the hybrid electric device according to present invention

FIG. 3 is a schematic view showing a laser etching process of forming an electrode pattern on a flexible piezoelectric polymer substrate in the fabrication process of the hybrid electric device according to present invention.

As shown in FIG. 3, a room-temperature dry etching technique based on a laser beam irradiation method is used to form a microelectrode pattern on the PVDF substrate.

The room-temperature dry etching process based on the laser beam irradiation method will be described below.

First, a metal or oxide-based electrode material is deposed on both surfaces of a flexible piezoelectric polymer substrate 1 such as the PVDF substrate to be used as a substrate of a flexible electronic device to thereby form a thin film 2.

In this case, in order to form a conductive material for formation of a transparent oxidation electrode, for example, such as a transparent conducting oxide (TCO), an indium tin oxide (ITO) is deposited on the substrate 1 by means of vacuum vapor deposition to thereby form an ITO electrode thin film 2.

In this manner, once the ITO electrode thin film 2 is formed on the PVDF substrate 1, an electrode patterning process is performed by a sublimation-type laser etching method in which a laser beam is directly irradiated to the electrode thin film at room temperature to sublimate and remove an electrode material at a selected specific irradiation region Referring to FIG. 3, there is shown an apparatus for performing a room-temperature dry etching process based on the laser irradiation on the electrode thin film 2 formed on the substrate 1. A laser light beam emitted from a laser light source can be irradiated to the electrode thin film along a desired specific path defined by an optical system. Also, a known laser apparatus can be used which can continuously move a region where the laser light beam is irradiated on a surface of a to-be-irradiated object, based on a laser scan movement.

For example, such a laser apparatus, as shown in FIG. 3, includes a laser light source 10 for generating and emitting a laser light beam, an optical system 11 for establishing an optical path of the light beam emitted from the laser light source 10 and continuously moving a region where the laser light beam is irradiated on a surface of a to-be-irradiated object, and a control computer 14 for controlling the laser output power and the overall operation of the laser light source 10 and controlling the driving (the pattern) of the optical system 11.

Here, the optical system 11 is a constituent element which receives the laser light beam emitted from the laser light source 10 and transfers it to the surface of the electrode thin film 2 formed on the PVDFD substrate 1 positioned adjacent to a position corresponding to a focal length so that the surface of the electrode thin film 2 can be scanned along an etching path defined thereon by the laser light beam.

The optical system 11 may include a mirror 12 and a lens. The optical system 11 allows a line drawing type laser scan to be performed in such a fashion that a region where the laser light beam is to be irradiated is continuously moved on the surface of the electrode thin film 2 along a defined etching path while the mirror and the lens are moved, so that the laser light beam traces the etching path on the surface of the electrode thin film.

Likewise, a continuous line drawing scheme-based laser scan is carried out along the etching path defined on the surface of the electrode thin film 2 formed on the flexible polymer substrate 1 by using the laser apparatus. In this case, the electrode material is sublimated and removed at the region where the laser light beam is irradiated and the remaining region of the electrode thin film on the substrate forms an electrode pattern (electric conductor).

In order to achieve an excellent effect and pattern result in such a laser etching process, it is preferable to permit a laser light beam to continuously scan the surface of the electrode thin film at a certain speed of several tens to hundreds mm/sec along an etching line path defined on the electrode thin film surface at the time of the laser scan.

In this case, the laser scan drive operation of the laser apparatus is performed on a two-dimensional basis in a "one-line drawing scheme". That is, a one-continuous line drawing is made by preventing the laser scanning operation from being interrupted or overlapped in the middle course in such a fashion that a laser irradiation region is caused to be moved along a predetermined linear path so as to allow consecutive pulse energy to be transferred along a region to be etched.

The irradiation of the laser light beam is repeated and overlapped at a certain specific region or the progress of the laser beam is instantaneously stopped, side effects such as local carbonation or surface irregularity occur. Thus, it is important to perform the laser scan drive operation of the laser apparatus in such a fashion that the one-continuous scan line is drawn along a defined etching path at a constant scan speed.

Such a laser irradiation-based room-temperature dry etching process employs a laser light beam having a pulse width of a picosecond or nanosecond unit, and the pulse width of the laser light beam can be properly adjusted in the picosecond or nanosecond level depending on the electrode material.

Before a laser light beam having a pulse width of the picosecond or nanosecond is directly irradiated to an electrode thin film to be patterned using a suitable optical energy and the heat energy is transferred to the substrate through an interface between the electrode thin film and the substrate, if the electrode material of a target region of the electrode thin film is sublimated during the picosecond or nanosecond time period to form a electrode pattern, it is possible to form an electric conductor for implementing a function of the electronic device, i.e., an electrode pattern, without any damage or deformation of the substrate.

Although there is a somewhat difference depending on the state of the interface between the electrode thin film and the substrate, since the energy transferred to the substrate during the picosecond or nanosecond time period through the irradiation of the laser light beam does not apply thermal burden and deformation to the substrate, it is possible to overcome the shortcoming of an existing etching process that makes it difficult or impossible to implement the electrode pattern on the thermoplastic polymer.

Like the case where the laser light beam has a pulse width of a femtosecond shorter than the nanosecond, when the pulse width of the laser light beam to be irradiated is not optimized, there may occur secondary problems including microcracks, insufficient material sublimation, protrusion of materials of a boundary portion, etc., at a pattern formation portion. Therefore, it is important to select a laser light source having a proper pulse width according to a to-be-patterned electrode material. In case of the ITO transparent oxidation electrode on the PVDF substrate, it is preferable to form a pattern on the electrode thin film using a nanosecond pulse-width laser.

In addition, Based on the fact that there is a difference in density of energy transferred to a to-be-etched electrode surface depending on the size of a focal point of the laser light beam being irradiated, the patterning process may be performed by determining a degree of a focal point having a suitable size conforming to the shape of a pattern which it is desired to form, or by decreasing the optical energy to a suitable level depending on an optical energy absorbance of the substrate and then repeatedly etching the electrode thin film surface while minimizing a undesired etching for the substrate.

In this case, the pulse energy of a laser light is repeatedly irradiated to a region where an electrode pattern is to be formed, more than several times to several tens of times in a repetitive line drawing scheme so as to sufficiently sublimate the electrode material, and preferably the electrode surface where the light beam is irradiated is processed under an inert gas atmosphere so as to minimize a degeneration or change of the material and simultaneously prevent surface adsorption or oxidation of the electrode material which may occur during the sublimation of the electrode material.

The number of times of the optical energy irradiations and the amount of energy irradiated can be adjusted depending on the physical properties such as the optical absorbance of the substrate, the surface roughness and the thickness of a thin film to be patterned, etc.

In order to help to form the electrode pattern in the laser irradiation-based room-temperature dry etching process, an additional mask may be disposed between the laser light source and the substrate. In this case, the laser light beam which has partially passed through the mask is irradiated to the electrode thin film on the substrate to thereby remove the electrode material of a region of the thin film where the laser light beam is irradiated while being sublimated and etched. Resultantly, the remaining region of the electrode thin film forms the electrode pattern.

Further, when the laser light beam is perpendicularly irradiated to the substrate, a laser light beam inversely reflected from the surface of the substrate may give a damage to the optical system as well as cause an interference for the laser light beam irradiated from the optical system to the substrate. Thus, preferably, the substrate can be fixedly positioned inclinedly at an arbitrary angle relative to a perpendicular direction to the direction in which the laser light beam is incident so as to avoid the side effects according to the reflection of the laser light beam from the substrate.

In this manner, unlike a conventionally known patterning process, the energy of the laser light beam is directly irradiated to the electrode material to be patterned in a pulse width of a picosecond or nanosecond unit so as to allow the electrode material to be sublimated from a solid state directly to a gaseous state such that a microelectrode pattern is formed on a thermoplastic polymer substrate in an intaglio method.

The laser irradiation-based room-temperature dry etching process can be carried out in a relatively simple manner as compared to a conventional etching method while having a high process speed at which productivity is ensured. Various flexible electronic devices based on a flexible polymer substrate can be developed by a process capable of forming a pattern on an organic/inorganic electrode material coated on a flexible thermoplastic polymer substrate at room temperature Particularly, the laser irradiation-based room-temperature dry etching process enables an electrode pattern to be more clearly formed on a substrate made of a thermoplastic polymer such as polyvinylidene fluoride while the electrode pattern having more excellent adhesion strength at the interface between the electrode and the substrate as compared to a nano-imprint process. Also, the room-temperature dry etching process has a merit in that it is absolutely advantageous in terms of stability and productivity since a processing is performed in a second/minute unit.

In the laser dry etching process for forming the electrode pattern on the polymer substrate, in order to separate an AC power applied to a vibration-generating device and a DC power applied to a display device, a memory device and a communication device, it is required that an electrode of the device to the DC power is applied should be electrically isolated from an electrode of the device to the AC power is applied. To this end, preferably, the device electrodes requiring the electrical isolation from each other can be subjected to a separate etching process for the purpose of electrical isolation, or an additional insulating layer (for separating the AC power applied to the vibration-generating device and the DC power applied to other devices from each other) can be formed. Here, formation of the additional insulating layer for separating the AC power and the DC power from each other will be described in detail later with reference to the drawings.

Basically, the electrodes of respective devices formed on a single PVDF substrate are required to be electrically isolated from each other so as to allow the devices to be driven independently of each other in the laser irradiation-based room-temperature dry etching process. That is, the respective devices have electrodes which are isolated electrically on the single substrate.

Besides, the electrode pattern 2a may be formed on the single substrate in such a fashion that a memory device 8b, a wireless communication device (for example, a long/short-range wireless communication device (not shown)) or the like can operate either independently or dependently of a display device 8a and a vibration-generating device (vibration-sensing device) 8c.

As describe above, once the electrode patterns 2a and 2b are formed on the piezoelectric polymer substrate 1 through the laser irradiation-based room-temperature dry etching process, an element of a corresponding device is formed at each predetermined device region.

First, the display device (light-emitting device) 8a can be formed at the predetermined region of the piezoelectric polymer substrate 1 on which the electrode patterns are formed by the room-temperature dry laser etching process. In this case, the electrode pattern 2a formed of a transparent conducting oxide (TCO), for example, an indium tin oxide (TIN) is used as a positive conductor for the display device.

An oxide film such as an ITO transparent oxidation electrode has an advantage in that it has a relatively increased transparency as compared to a conductive polymer film disclosed in the conventional patents as well as its electrical sheet resistance indispensable for the operation of the device can be relatively decreased up to less than 100 $\Omega/cm^2$ as compared to the conventional conductive polymer film having a sheet resistance of 1 $k\Omega/cm^2$, thereby enabling low-power operation.

Further, the oxide thin film has a high hardness and a high adhesion strength at the interface between the thin film and the substrate. Thus, the electrode thin film can be operated even when a sound pressure level (SPL) is increased up to more than 80 dB in a frequency range between 700 Hz and 1 kHz upon the driving of a sound (vibration)-generating device based on the PVDF. Resultantly, the oxide thin film has a merit in that it can relatively improve the sound pressure as compared to the conventional conductive polymer film.

A light-emitting layer having a display function may include all the organic and inorganic light-emitting layers, and a transparent organic/inorganic material is preferably used to enhance the transparency at the time of inactivation thereof.

In FIG. 1, there is shown an example of the device employing an electrochromic material.

Referring to FIG. 1, in a state where an ITO electrode layer (electrode pattern) (hereinafter, referred to as "lower electrode") 2a is formed on a PVDF substrate 1 by the room-temperature dry etching method based on the laser irradiation, an electrochromic layer 3, an electrolyte layer 4 and an upper electrode 5 as light-emitting layers are sequentially stacked on the lower electrode 2a to make up a display device 8a.

In this case, the material of which the electrochromic layer 3 is made may include an oxide such as WOx and $TiO_2$, and an electrolyte material for the charge exchange with the electrochromic material is stacked in the form of a thin film on the electrochromic layer 3 to form the electrolyte layer 4. Thereafter, the TIO is deposited on the electrolyte layer 4 to form the upper electrode 5.

The display device 8a as constructed above is operated independently of the vibration-generating device/vibration-sensing device 8c that is operated in a state of being integrally formed with the single PVDF substrate 1. At this time, the display device 8a is driven with a DC power applied thereto in an electrical DC mode.

By the above configuration, it is possible to implement a display device based on a transparent oxidation electrode having an increased adhesion strength at the interface between the electrode and the substrate.

In order to further enhance the flexibility of the display device, an organic single molecular material, an organic polymer material and the like besides the electrochromic material may be used as the light-emitting layer.

Figure 4:
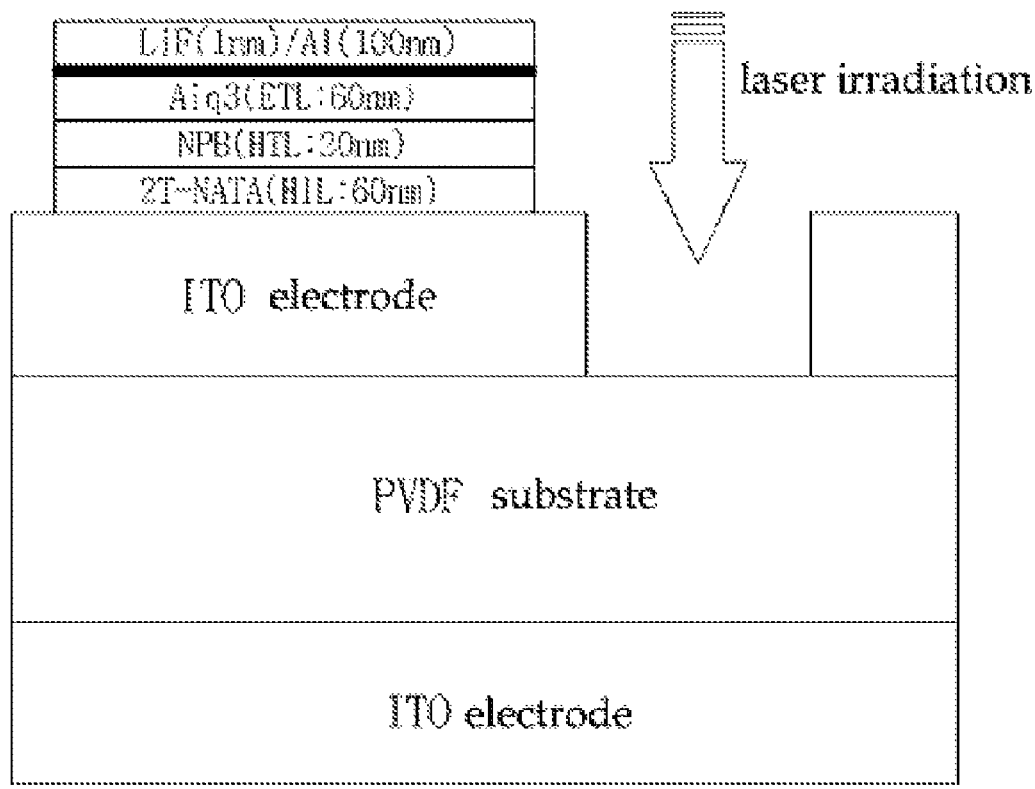
FIG. 4 is a schematic cross-sectional view showing a fabrication example of an organic light-emitting device (OLED) formed on a PVDF substrate in the hybrid electric device according to present invention

FIG. 4 is a schematic cross-sectional view showing a fabrication example of an organic light-emitting device (OLED) formed on a PVDF substrate in the hybrid electric device according to present invention.

In FIG. 4, there is shown a state where the microelectrode pattern is formed on the PVDF substrate by laser irradiation. Also, there is shown a structure in which the ITO electrode layer patterned by the laser irradiation is used as a lower electrode, and a light-emitting layer and an upper electrode are stacked on the ITO electrode layer. In this case, an LiF layer and an Al layer are sequentially stacked on the light-emitting layer.

Figure 5:
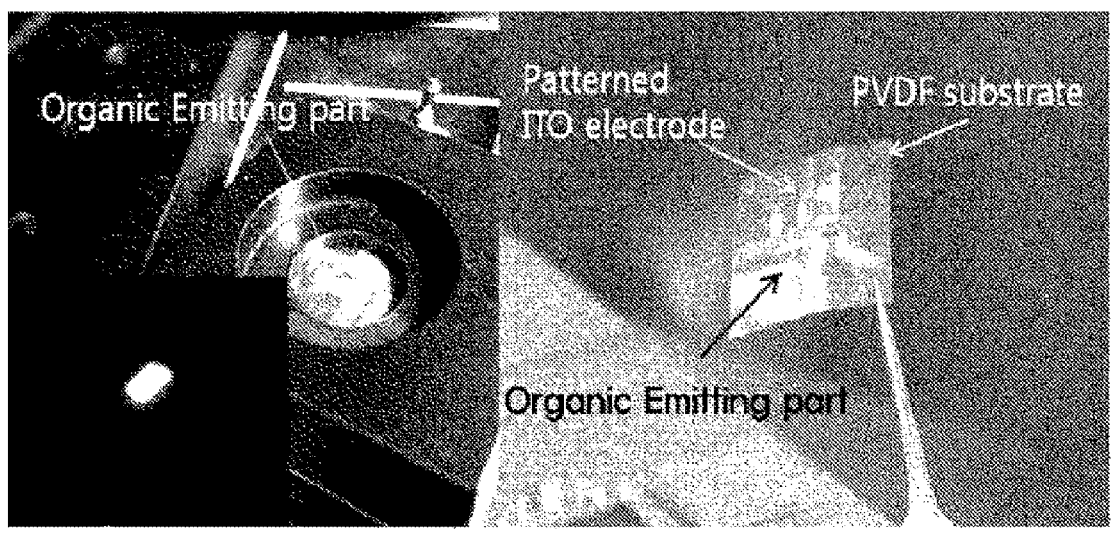
FIG. 5 is a photograph showing a state in which the organic light-emitting device formed on the PVDF substrate emits light in the hybrid electric device according to present invention
Figure 6:
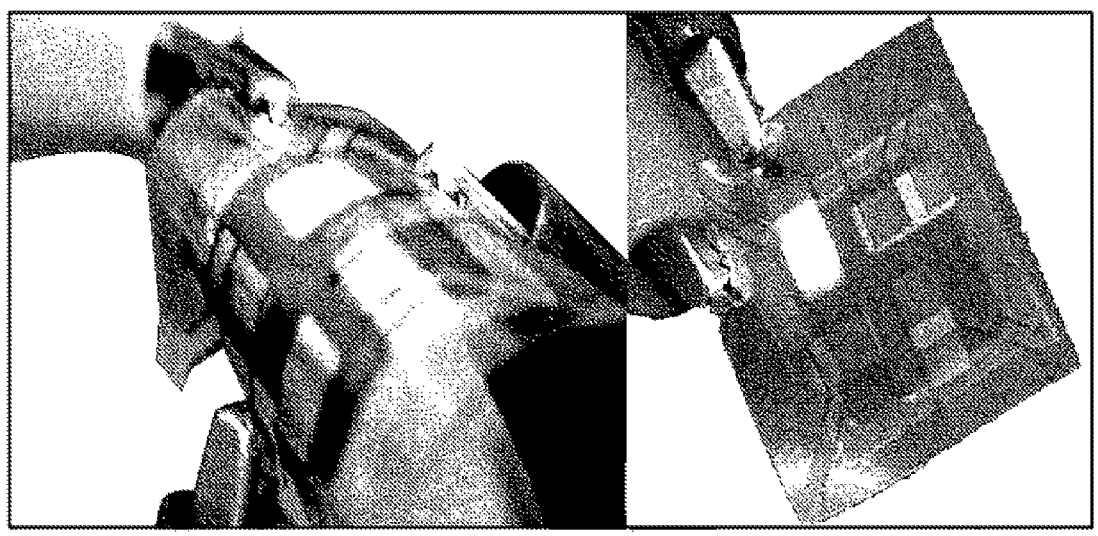
FIG. 6 is a photograph showing a state in which the organic light-emitting device formed on the PVDF substrate emits light with it bent in the hybrid electric device according to present invention

FIGS. 5 to 10 are views associated with the operation of the organic light-emitting device shown in FIG. 4, wherein FIG. 5 is a photograph showing a state in which the organic light-emitting device formed on the PVDF substrate emits light in the hybrid electric device according to present invention, and FIG. 6 is a photograph showing a state in which the organic light-emitting device formed on the PVDF substrate emits light with it bent in the hybrid electric device according to present invention.

Figure 7:
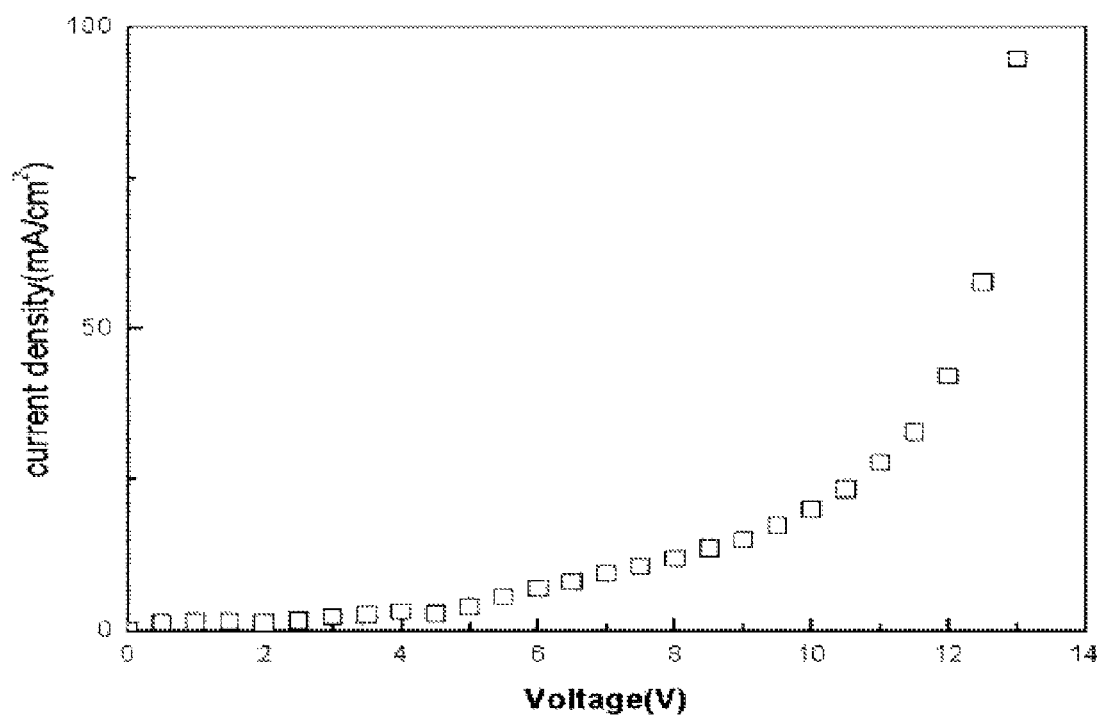
FIG. 7 is a graph showing an I-V characteristic curve of the organic light-emitting device formed on the PVDF substrate in the hybrid electric device according to present invention
Figure 8:
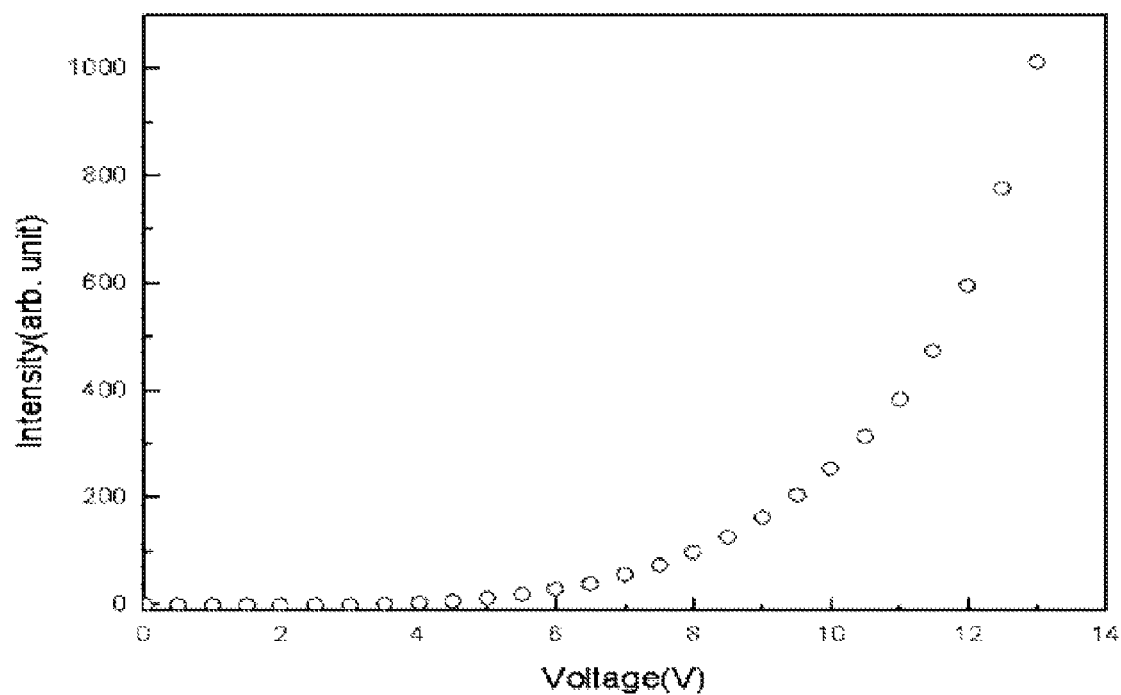
FIG. 8 is a graph showing an L-V characteristic curve of the organic light-emitting device formed on the PVDF substrate in the hybrid electric device according to present invention
Figure 9:
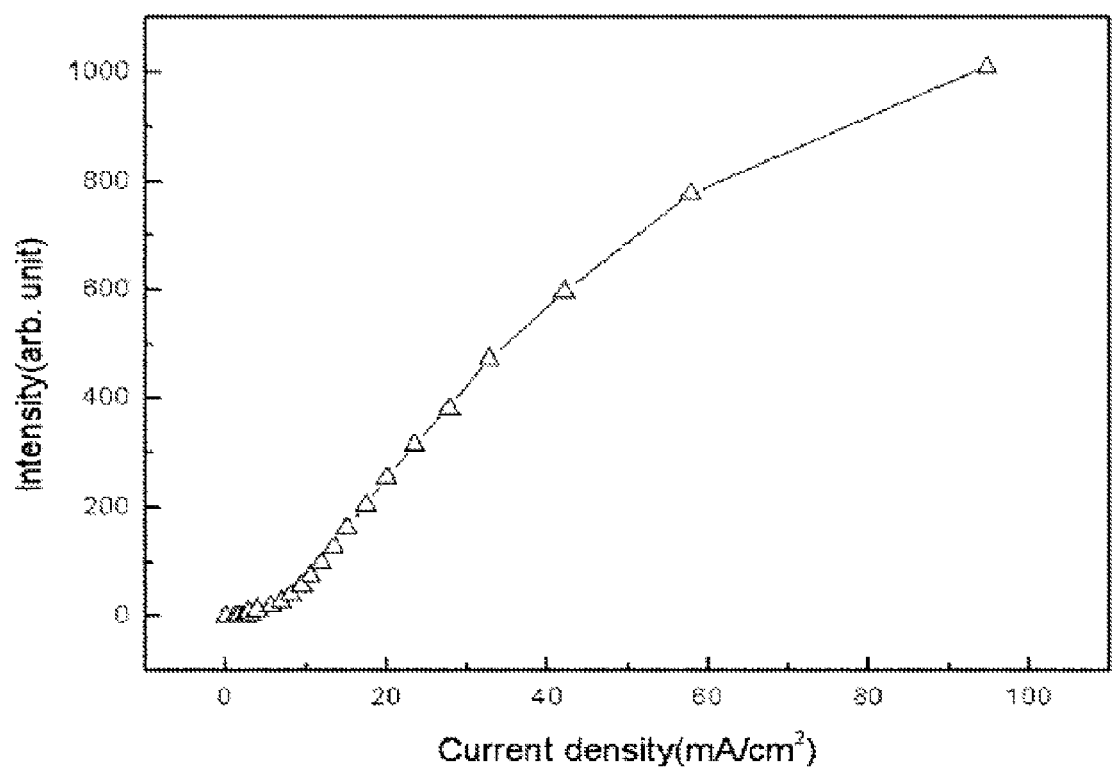
FIG. 9 is a graph showing an L-I characteristic curve of the organic light-emitting device formed on the PVDF substrate in the hybrid electric device according to present invention
Figure 10:
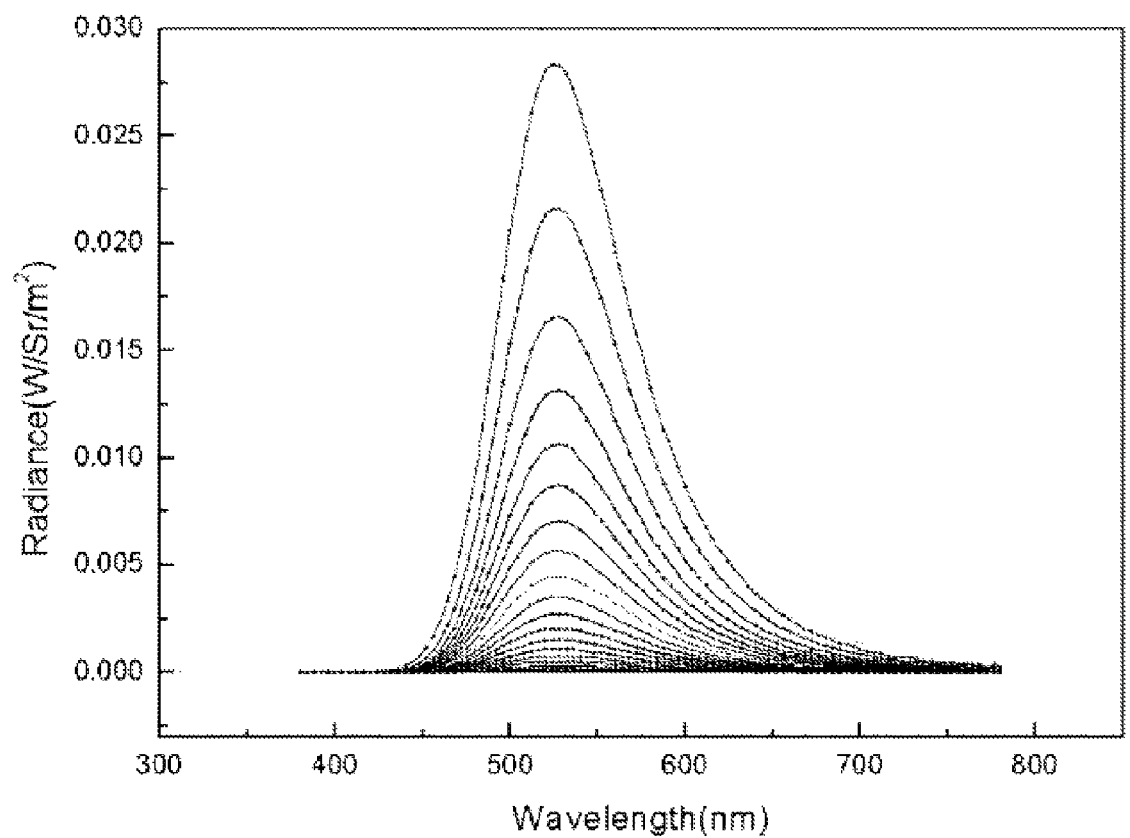
FIG. 10 is a graph showing a luminescence characteristic curve of the organic light-emitting device formed on the PVDF substrate in the hybrid electric device according to present invention

Also, FIG. 7 is a graph showing an I-V characteristic curve of the organic light-emitting device formed on the PVDF substrate in the hybrid electric device according to present invention, FIG. 8 is a graph showing an L-V characteristic curve of the organic light-emitting device, FIG. 9 is a graph showing an L-I characteristic curve of the organic light-emitting device, and FIG. 10 is a graph showing a luminescence characteristic curve of the organic light-emitting device.

In the meantime, a vibration-generating device (or vibration-sensing device) 8c may be additionally formed on the PVDF substrate 1 so as to share the PVDF substrate 1 together with the display device 8a. The vibration-generating device (or vibration-sensing device) 8c can be used as a device for generating sound (sound wave) or vibration or sensing sound or vibration generated from the outside by applying the AC voltage to ITO electrodes 2a and 2b in a state where the ITO electrodes 2a and 2b are formed both surfaces of the PVDF substrate 8c as a piezoelectric polymer substrate, respectively. Such a vibration (sound)-generating device can be applied to a vibration-generating device built in electronic appliances or a thin film speaker. On the contrary, the vibration (sound)-generating device may be applied to a vibration sensor or a sound (sound wave) sensor.

In the vibration-generating device, basically the electrodes can sufficiently perform its own function if it is formed of a conductor electrode material capable of applying an electric field across the electrodes and the PVDF substrate, and can maintain transparency. The material of which the electrodes are made may employ an n-type oxide or a p-type oxide (NiO, CuO, $CuAlO_2$, $SrCu_2O_2$, LCMO (LaCaMnO), LSMO (LaSrMnO), etc.) including ZnO, $SnO_2$ and $TiO_2$ and a conductive polymer material besides the ITO.

In addition, the vibration-generating device is constructed to be electrically isolated from the display device and the memory device. The vibration-generating device may also be driven independently of the display device and the memory device with a AC power applied thereto in an electrical AC mode.

In the fabrication of the device, an electrode material is deposited on the PVDF substrate 8c as the piezoelectric polymer substrate and then a lattice-like microelectrode 2a is formed by using the laser irradiation-based room-temperature dry etching process, so that the mechanical properties of the vibration-generating device or the vibration-sensing device using the piezoelectric characteristics of the PVDF can be properly varied.

Like this, it is possible to constitute a device 8c having a vibration-generating and vibration-sensing function which independently utilizes the piezoelectric characteristics of the PVDF. Such a vibration-generating or vibration-sensing device 8c is implemented on the single substrate together with the display device 8a so that it is possible to overcome the weakness in terms of space and weight which an existing speaker or a ceramic-based vibration sensor entails.

If the device 8c having the vibration-generating and vibration-sensing function is integrally formed on the single substrate along with the display device 8a, it is possible to implement an integrated thin film TV and a high-functional high-functional vibration generating and sensing apparatus.

Figure 11:
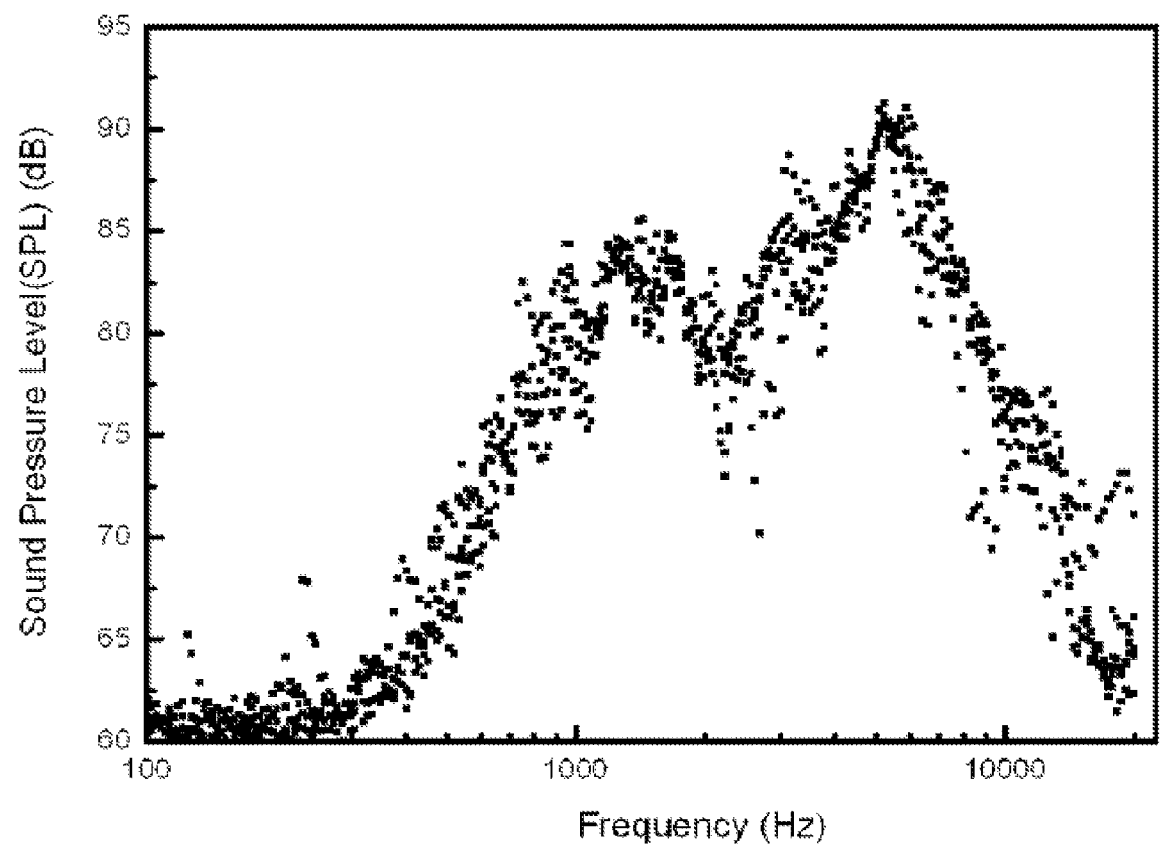
FIG. 11 is a graph showing a voltage to-sound pressure characteristic curve in an example of the operation of an acoustic vibration-generating device in the hybrid electric device according to present invention

FIG. 11 is a graph showing a voltage to-sound pressure characteristic curve in an example of the operation of an acoustic vibration-generating device in the hybrid electric device according to present invention.

Next, a non-volatile memory device 8b can be formed on the same single PVDF substrate 1 along with the display device 8a and the vibration-generating device 8c through additional electrode patterning and device forming processes. Based on the implementation of the electrode operating stably at a flexible state and the microelectrode pattern, it is possible to construct various electronic devices such as OBD, PoRAM, RFID and a communication device (long/short-range wireless communication device or the like) on the same substrate through the additional electrode patterning and device forming processes.

In order to construct the memory device 8b, first, the microelectrode pattern 2a, i.e., the lower electrode to be used as a positive conductor is formed on the PVDF substrate 1 through the laser irradiation-based room-temperature dry etching process. Thereafter, a nano particle-containing conductive polymer layer 6 is formed on the lower electrode 2a.

To this end, a conductive polymer material such as PVK (Poly(N-vinylcarbazole)) or the like and nano-particles such as CdSe or ZnS are mixed with each other in a solvent such as 1,2-dichloroethane or the like to thereby prepare a PKV solution containing nano-particles. Then, a PKV thin film containing the nano-particles are stacked on the lower electrode through a process in which the PKV solution is uniformly deposited on the lower electrode patterned on the substrate using a spin coating apparatus, is coated on the surface of a selected region on the lower electrode using an inkjet printer, or is vacuum-deposited on the surface of the selected region on the lower electrode using a mask.

Once the PKV thin film containing the nano-particles is formed on the lower electrode, an aluminum (AL) layer is deposited thereon to allow an upper electrode 7 to be used as a negative electrode to be stacked on the PDV thin film. The memory device 8b can be formed through such a series of processes.

The memory device 8b or the communication device is configured to operate either independently or dependently of the display device 8a and the vibration-generating device (vibration-sensing device) 8c. These devices may be configured to be positioned on all the both surfaces of the PVDF substrate 1. In case where the devices are formed in a stacked fashion, the patterning process may be performed to enable a selective pattern formation for a conventional formed layer structure depending on the selection and combination of the wavelength and the output power of the laser light source to be used in the room-temperature dry etching process.

The memory device 8b as constructed above exhibits a bistable electrical device characteristic in which a current variation $I_{on}/I_{off}$ of more than 100 times occurs at the same voltage when there is a voltage variation in the upper and lower electrodes 7 and 2a during the application of the DC power to the upper and lower electrodes 7 and 2a. This bistable electrical device characteristic can be applied to a non-volatile memory device (organic bistable non-volatile memory device).

Figure 12:
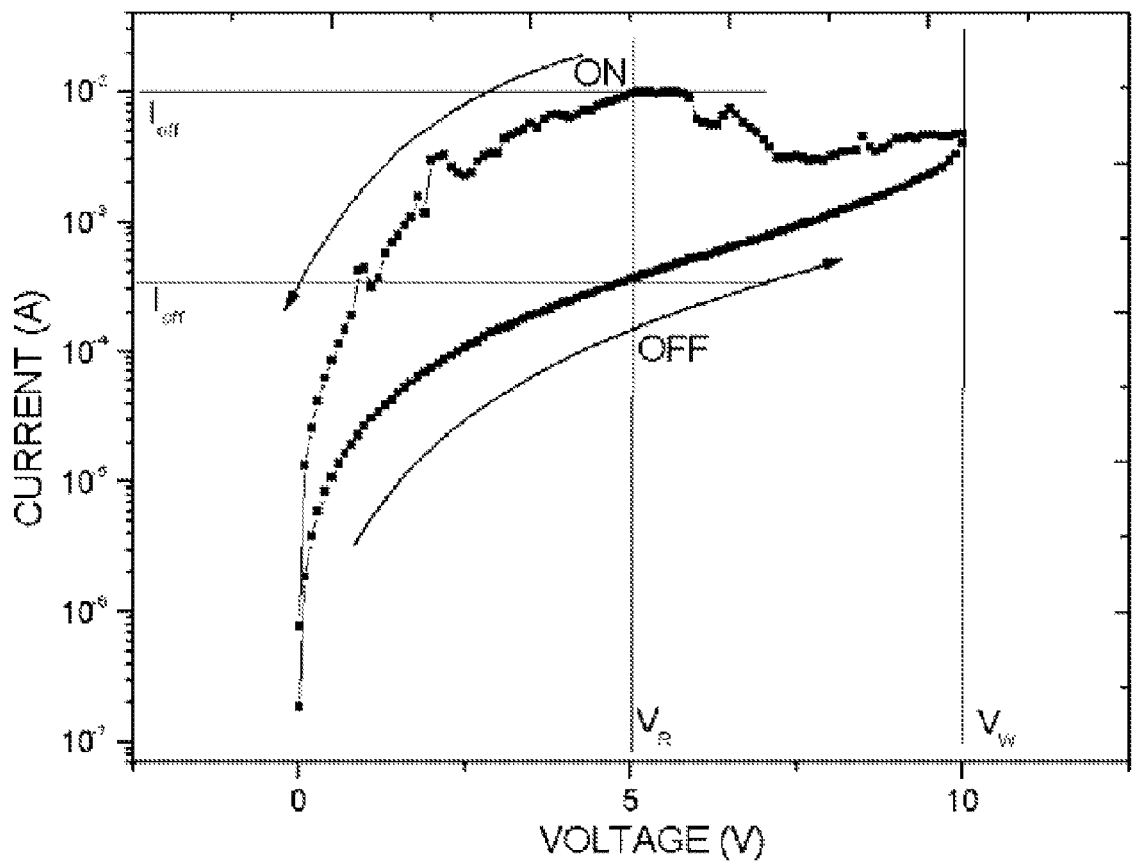
FIG. 12 is a graph showing an I-V characteristic curve of a non-volatile memory device being operated in the hybrid electric device according to present invention and FIG. 13 is a schematic cross-sectional view showing the hybrid electric device embedded with an insulating layer according to another preferred embodiment of the present invention.

FIG. 12 is a graph showing an I-V characteristic curve of a non-volatile memory device being operated in the hybrid electric device according to present invention.

A read voltage $V_R$ of the same level is applied to the memory device to perform the read-out operation in an ON state. At this time, the current flowing in the memory device is $I_{on}$ which is much greater than $I_{off}$. A drive circuit detects such a current difference to determine the state of the memory device.

Due to the inner electric field generated by electrons captured in the proximity of the upper electrode (Al electrode), an electric field between the conductive polymer layer containing CdSe nano-particles by which electrons are captured and the upper electrode is decreased with respect to the same voltage $V_R$, whereas the conductive polymer layer and the lower electrode (ITO electrode) is increased.

Thus, a hole injection efficiency in the ITO electrode is increased to cause much more current to flow in the ITO electrode in the same voltage $V_R$. This is a principle in which the memory device memorizes its state.

In the above, the configuration examples of devices of the hybrid electric device according to the present invention have been described in detail.

In the actual fabrication of the hybrid electric device of the present invention, it is possible to seal the hybrid electric device of the present invention by simply attaching a typical moisture-preventing tape or patch without using an ultra-violet adhesive or ultra-violet (UV) irradiation in order to form a protective film against a factor of degrading the performance of the device such as external gas or moisture.

Conventionally, to suppress infiltration of moisture into an organic light-emitting layer which is a moisture-susceptible layer while being the most important portion, after a UV-activating adhesive has been coated on a molded covering glass substrate in consideration of the thickness of a moisture-adsorbing patch, the covering glass substrate is in close contact with the substrate formed with the organic light-emitting device. Then, the substrate is exposed to the UV ray for a given time in a state of being securely fixed to a metal jig, and then is solidified and sealed, thereby coping with the infiltration of moisture in the air into the device.

On the other hand, the hybrid electric device of the present invention is preferably sealed by using a moisture-preventing tape made of an inorganic amorphous material instead of the conventional covering glass in consideration of reactivity of the thermoplastic polymer substrate (PVDF substrate) to the UV-ray exposure and the UV-activating adhesion solvent.

The inventive hybrid electric device can be applied and developed in a device type configured such that the vibration-sensing device detects vibration and coverts a mechanical signal into an electrical signal for application to the display device, stores a history about the above operation in the integrated memory device, transmits its signal or its history through the communication device to the outside, transfers a previously calculated type vibration relative to the detected vibration to the substrate inversely and actively affects the vibration generated earlier, or converts the detected vibration into electrical energy and stores the converted electrical energy.

Figure 13:
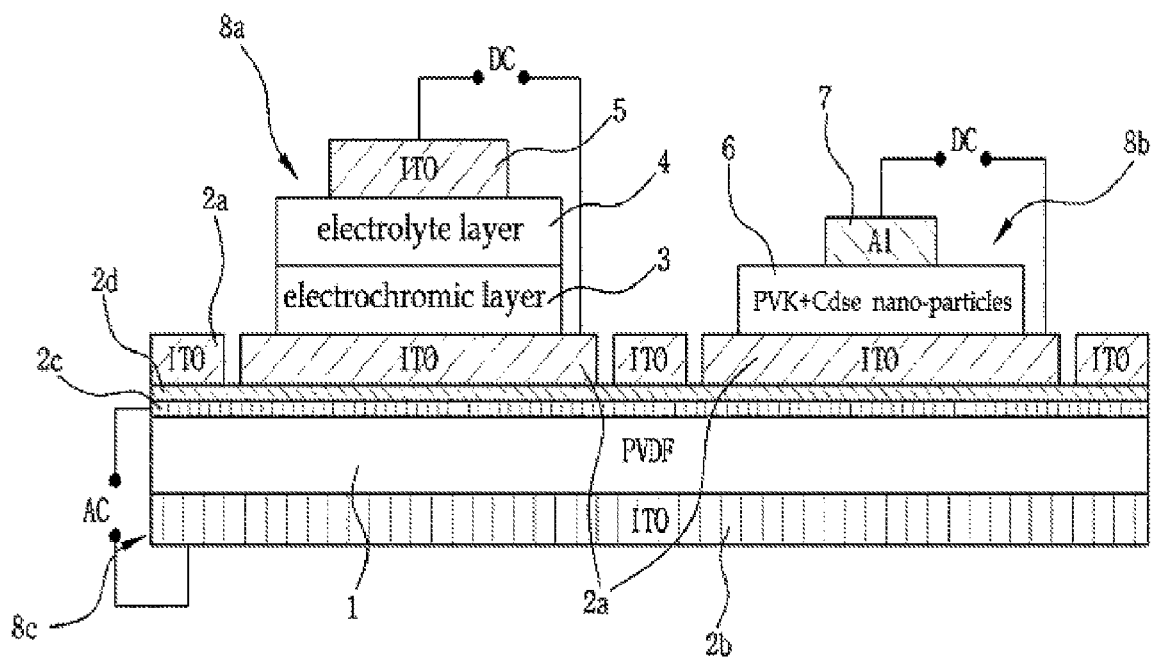

In addition, in the inventive hybrid electric device, the laser irradiation-based room-temperature dry etching process is independently performed on the vibration-generating device, the display device, the memory device, the communication device and the like so as to separate the AC power applied to the vibration-generating device and the DC power applied to the display device, the memory device, the communication device and the like, or a separate insulating layer is embeddedly formed in inventive hybrid electric device as shown in FIG. 13.

FIG. 13 is a schematic cross-sectional view showing the hybrid electric device embedded with an insulating layer according to another preferred embodiment of the present invention.

As shown in FIG. 13, a separate electrode 2c for a vibration-generating device 8c is formed on a PVDF substrate 1, an insulating layer 2d is formed on the separate electrode 2c, and an electrode material is deposited on the insulating layer 2d. Thereafter, the deposited electrode layer is subjected to the laser irradiation-based room-temperature dry etching process to form microelectrode patterns 2a for predetermined regions by each device, such that the microelectrode patterns 2a can be used as electrodes for the remaining devices, i.e., a display device 8a, a memory device 8b, a communication device and the like.

Likewise, it is possible fabricate an integrated, composite hybrid electric device in which the AC power and the DC power are separated from each other by means of the insulating layer 2d interposed between the separate electrode 2c for the vibration-generating device 8c and the electrode patterns 2a for the remaining devices other than the vibration-generating device 8c so as to electrically isolate the separate electrode 2c and the electrode patterns 2a from each other.

According to the present invention, it is possible to provide a new concept of an active element in which electrical devices such as an electrically bistable flexible volatile memory device and a display device are integrally combined with devices having a vibration or sound generating function or a vibration or sound sensing function by using PVDF as flexible piezoelectric polymer. Such an active element will be able to be usefully applied in fabrication of flexible type electronic equipment.

Further, as described above, according to the present invention, the microelectrode patterns for implementation of a function of each device are formed by using a direct irradiation of a heatless laser so as to achieve the maintenance of high adhesion strength at the interface between the electrode and the substrate while minimizing a thermal damage of a polymer substrate such as a PVDF substrate, so that various electric devices can be implemented on the flexible polymer substrate. Furthermore, it is possible to apply an integrated, composite hybrid electric device including a sound and vibration generating/sensing type display device.

Moreover, the present invention is expected to be useful in the development and fabrication of a new concept integrated, composite hybrid electric device in a flexible substrate development market which will be deployed in the future as it is extended in its application to a next-generation display device.

As mentioned above, the specific preferred embodiments according to the present invention has been illustrated and described.

INDUSTRIAL APPLICABILITY

According to the multi-functional integrated hybrid electric device and fabrication method thereof, since the various functions of a display device, and a non-volatile memory device, a vibration (sound)-generating device/speaker, a vibration-sensing device, a long/short-range wireless communication device and the like can be implemented on a single flexible polymer substrate, the area needed to occupy the devices is greatly reduced, thereby making it possible to manufacture high-efficiency and multi-functional electronic equipment enabling for miniaturization, lightness, thinness thereof and having improved portability and mobility, and providing merits of cost reduction and the like.

In addition, various devices such as semiconductor devices, communication devices, sensors and the like are integrally implemented on the single flexible substrate by overcoming the conceptual limitation of a flexible display device implementing an existing visual display function as well as the conventional viewpoint suggesting a simple speaker-based electronic equipment concept, thereby addressing and solving the temporal and physical shortcomings according to an existing construction for separating a display device, a speaker, a memory for storing electrical signals therein, and a calculation/operation unit from one another.

Since the hybrid display device of the present invention has a variety of applicability fields while having various advantages including being transparent, well flexible, convenient to carry, and low in its driving voltage, it is expected to create lots of market demands in at home and abroad.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A hybrid electric device using a piezoelectric polymer substrate, the hybrid electric device being constructed by forming an integrated unit in which a display device and a vibration-generating or -sensing device share the piezoelectric polymer substrate,
wherein the hybrid electric device comprises:
a flexible piezoelectric polymer substrate;
an electrode pattern formed, by vacuum-depositing an electrode material on both surfaces of the flexible piezoelectric polymer substrate to form electrode thin films and by patterning at least one of the electrode thin films through a laser irradiation-based room-temperature dry etching process;
a light-emitting layer stacked on the electrode pattern and an electrode stacked on the light-emitting layer,
wherein the display device uses the electrode pattern on which the light-emitting layer is stacked and the electrode stacked on the light-emitting layer as electric conductors, and the vibration-generating or -sensing device uses the electrode thin films formed on the both surfaces of the flexible piezoelectric polymer substrate as electric conductors.

2. The hybrid electric device of claim 1, wherein the hybrid electric device is constructed by forming an integrated unit in which a memory device shares share the piezoelectric polymer substrate together with the display device and the vibration-generating or -sensing device,
wherein the hybrid electric device further comprises:
a conductive polymer layer stacked on the electrode pattern, the conductive polymer having nano-particles contained therein and
an electrode stacked on the conductive polymer layer,
wherein the memory device uses the electrode pattern on which the conductive polymer layer is stacked and the electrode stacked on the conductive polymer layer as electric conductors.

3. The hybrid electric device of claim 1, wherein the piezoelectric polymer substrate is a polyvinylidene fluoride (PVDF) substrate.

4. The hybrid electric device of claim 1, wherein the electrode thin films formed by vacuum-depositing the electrode material are transparent oxidation electrode thin films.

5. The hybrid electric device of claim 4, wherein the transparent oxidation electrode thin films are ITO electrode thin films.

6. The hybrid electric device of claim 1, wherein the piezoelectric polymer substrate and the electrode pattern have an additional electrode and an insulating layer interposed therebetween in such a fashion that the additional electrode are stacked on the piezoelectric polymer substrate and the insulating layer is stacked on the additional electrode.

* * * * *